(12) United States Patent
Shen et al.

(10) Patent No.: US 7,615,853 B2
(45) Date of Patent: Nov. 10, 2009

(54) CHIP-STACKED PACKAGE STRUCTURE HAVING LEADFRAME WITH MULTI-PIECE BUS BAR

(75) Inventors: Geng-Shin Shen, Hsinchu (TW); Wu-Chang Tu, Hsinchu (TW)

(73) Assignees: CHIPMOS Technologies Inc., Hsinchu (TW); CHIPMOS Technologies (Bermuda) Ltd., Hamilton (BM)

( * ) Notice: Subject to any disclaimer, the term of this patent is extended or adjusted under 35 U.S.C. 154(b) by 14 days.

(21) Appl. No.: 11/826,413

(22) Filed: Jul. 16, 2007

(65) Prior Publication Data
US 2008/0061412 A1 Mar. 13, 2008

(30) Foreign Application Priority Data
Sep. 12, 2006 (TW) .............................. 95133664 A

(51) Int. Cl.
H01L 23/495 (2006.01)
H01L 23/043 (2006.01)
H05K 7/18 (2006.01)

(52) U.S. Cl. .............................. 257/676; 257/E23.031; 257/E23.036; 257/E23.043; 257/E23.047; 257/E23.052; 257/686; 257/777; 257/723; 257/784; 257/786; 257/670; 257/666; 361/813

(58) Field of Classification Search ................. 257/676, 257/E23.031, E23.036, E23.043, E23.047, 257/E23.052, 686, 723, 777, 784, 786, 670; 361/813
See application file for complete search history.

(56) References Cited

U.S. PATENT DOCUMENTS

| | | | |
|---|---|---|---|
| 5,334,803 A | 8/1994 | Yamamura et al. | |
| 5,373,189 A | 12/1994 | Massit et al. | |
| 5,473,196 A | 12/1995 | De Givry | |
| 5,998,864 A | 12/1999 | Khandros et al. | |
| 6,133,626 A | 10/2000 | Hawke et al. | |
| 6,261,865 B1 | 7/2001 | Akram | |
| 6,376,904 B1 | 4/2002 | Haba et al. | |
| 6,437,427 B1 | 8/2002 | Choi | |
| 6,461,897 B2 | 10/2002 | Lin et al. | |
| 6,501,183 B2 * | 12/2002 | Kanemoto et al. | 257/777 |
| 6,514,794 B2 | 2/2003 | Haba et al. | |
| 6,605,875 B2 | 8/2003 | Eskildsen | |
| 6,621,155 B1 | 9/2003 | Perino et al. | |
| 6,630,373 B2 | 10/2003 | Punzalan et al. | |
| 6,650,008 B2 | 11/2003 | Tsai et al. | |
| 6,759,307 B1 | 7/2004 | Yang | |
| 6,843,421 B2 | 1/2005 | Chhor et al. | |

(Continued)

Primary Examiner—Alexander O Williams
(74) Attorney, Agent, or Firm—Ming Chow; Sinorica, LLC

(57) ABSTRACT

The present invention provides a chip-stacked package structure with leadframe having multi-piece bus bar, comprising: a leadframe composed of a plurality of inner leads arranged in rows facing each other, a plurality of outer leads, and a die pad, wherein the die pad is provided between the plurality of inner leads arranged in rows facing each other and is vertically distant from the plurality of inner leads; a chip-stacked structure formed with a plurality of chips stacked together and provided on the die pad, the plurality of chips and the plurality of inner leads arranged in rows facing each other being electrically connected with each other; and an encapsulant provided to cover the chip-stacked structure and the leadframe; wherein the leadframe comprises at least a bus bar provided between the plurality of inner leads arranged in rows facing each other and the die pad, the bus bar being formed by multiple pieces.

14 Claims, 12 Drawing Sheets

U.S. PATENT DOCUMENTS

| | | |
|---|---|---|
| 6,900,528 B2 | 5/2005 | Mess et al. |
| 6,949,835 B2 | 9/2005 | Konishi et al. |
| 7,015,586 B2 | 3/2006 | Chien |
| 7,015,587 B1 * | 3/2006 | Poddar .................. 257/777 |
| 7,095,104 B2 | 8/2006 | Blackshear |
| 7,145,247 B2 | 12/2006 | Kawano et al. |
| 2004/0164392 A1 | 8/2004 | Lee |
| 2005/0121753 A1 * | 6/2005 | Lee et al. .................. 257/666 |
| 2005/0153480 A1 * | 7/2005 | Oka .......................... 438/106 |
| 2008/0054432 A1 * | 3/2008 | Corisis et al. ............... 257/686 |
| 2008/0061411 A1 * | 3/2008 | Shen et al. ................. 257/670 |
| 2008/0061421 A1 * | 3/2008 | Shen et al. ................. 257/686 |
| 2008/0099892 A1 * | 5/2008 | Chen et al. ................. 257/670 |
| 2008/0099896 A1 * | 5/2008 | Shen et al. ................. 257/676 |
| 2008/0138933 A1 * | 6/2008 | Yoshida ..................... 438/109 |

* cited by examiner

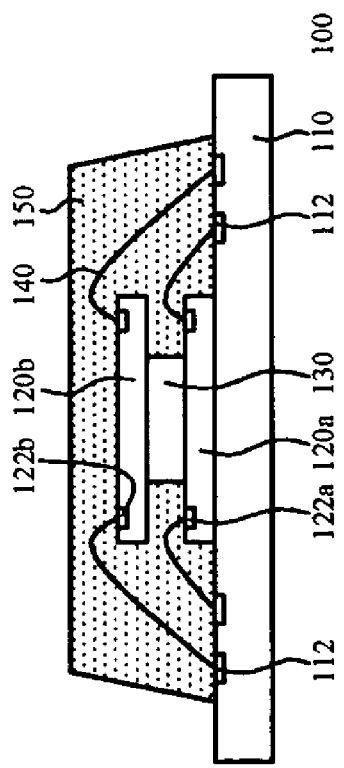
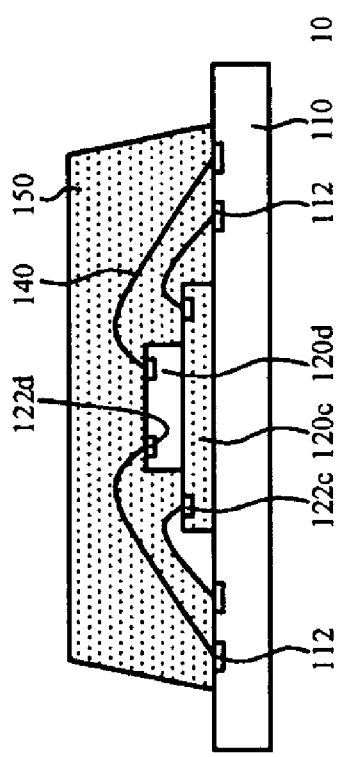

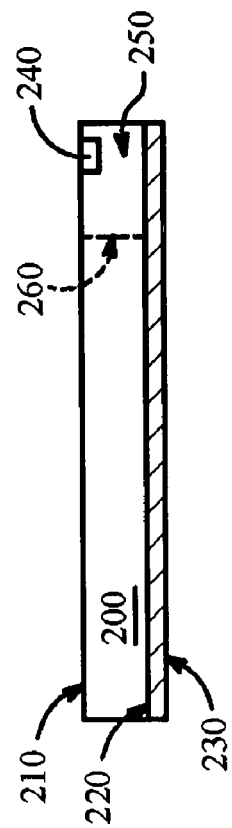
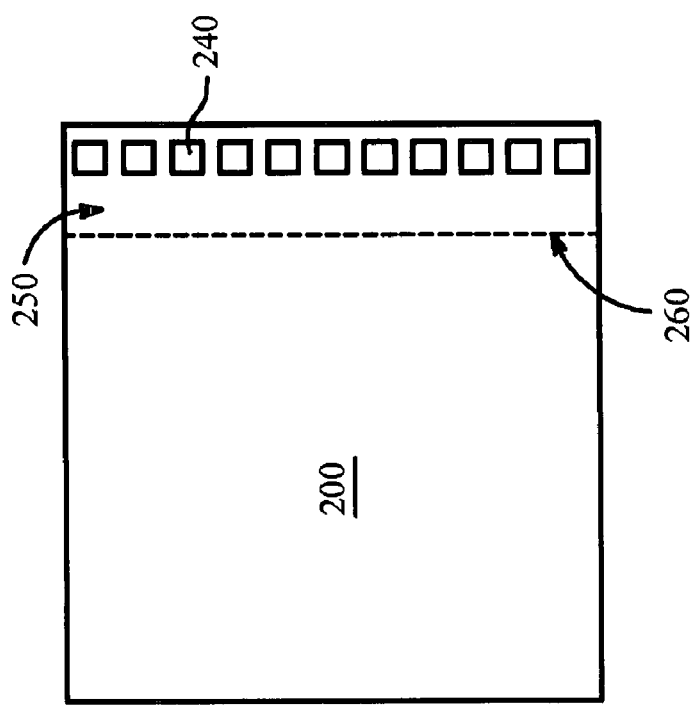
FIG. 2B
FIG. 2A

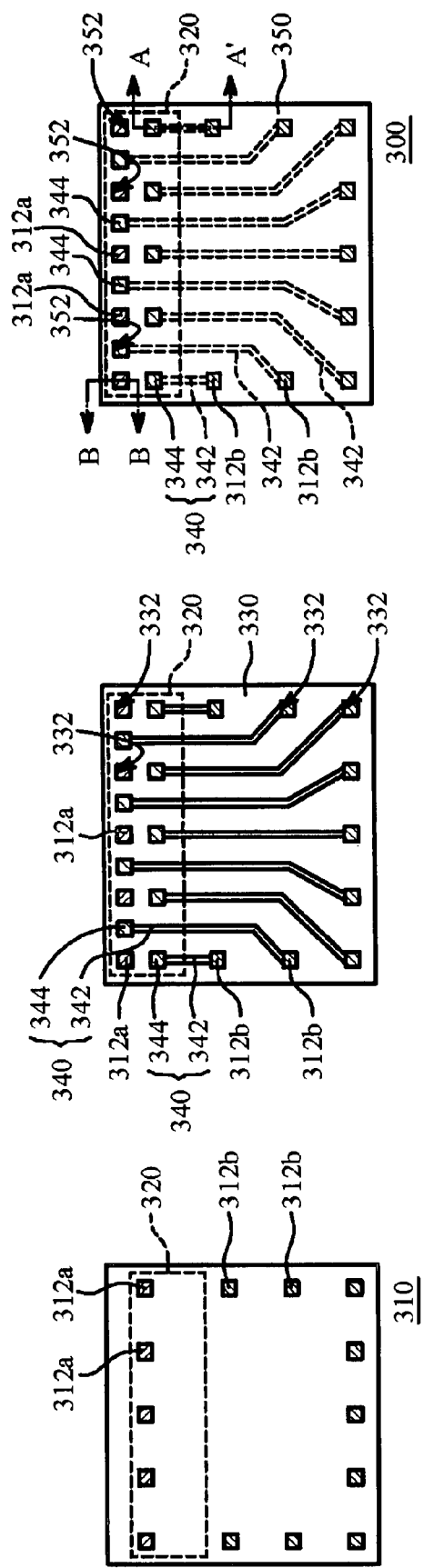

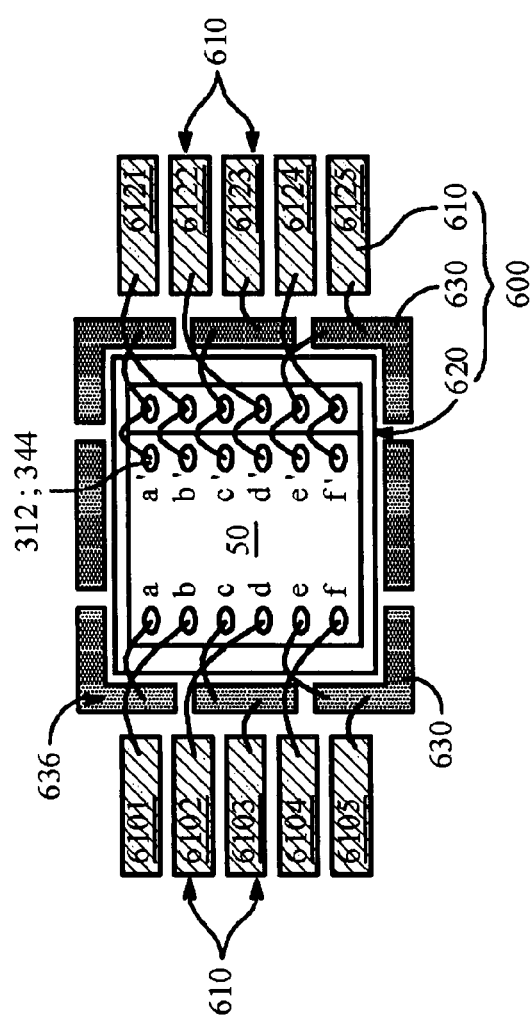
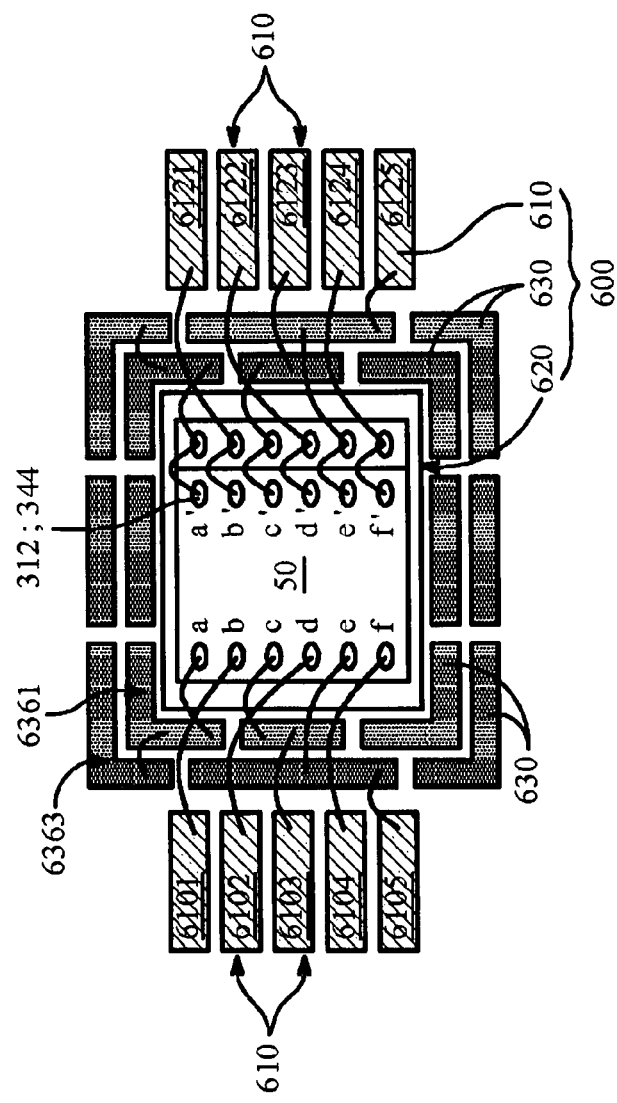
FIG. 7A
FIG. 7B

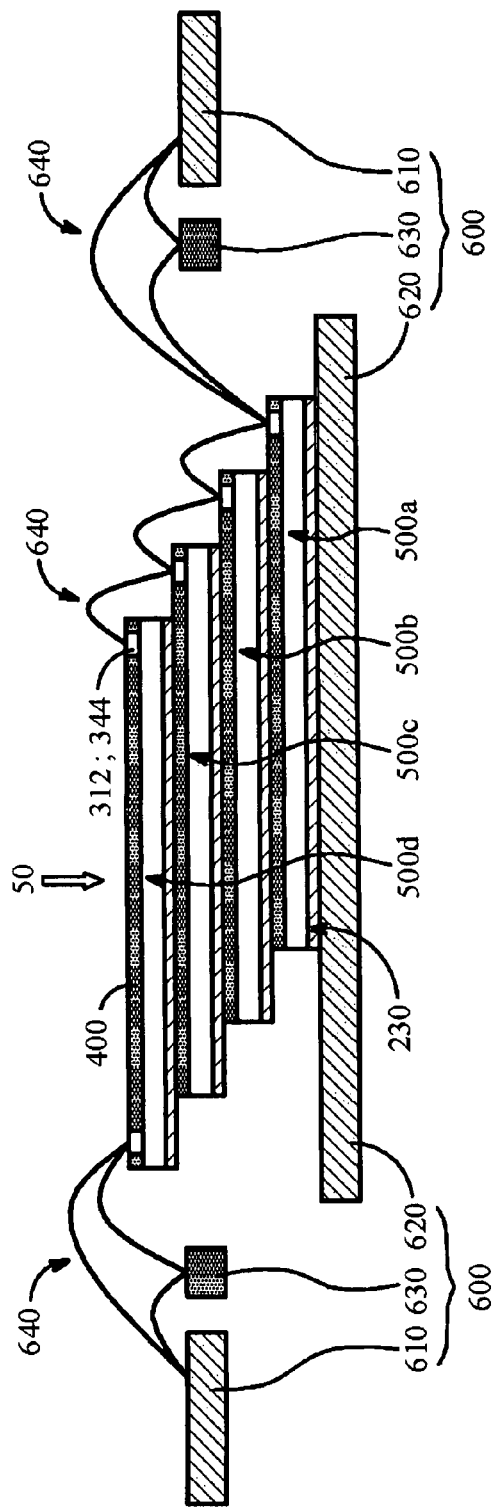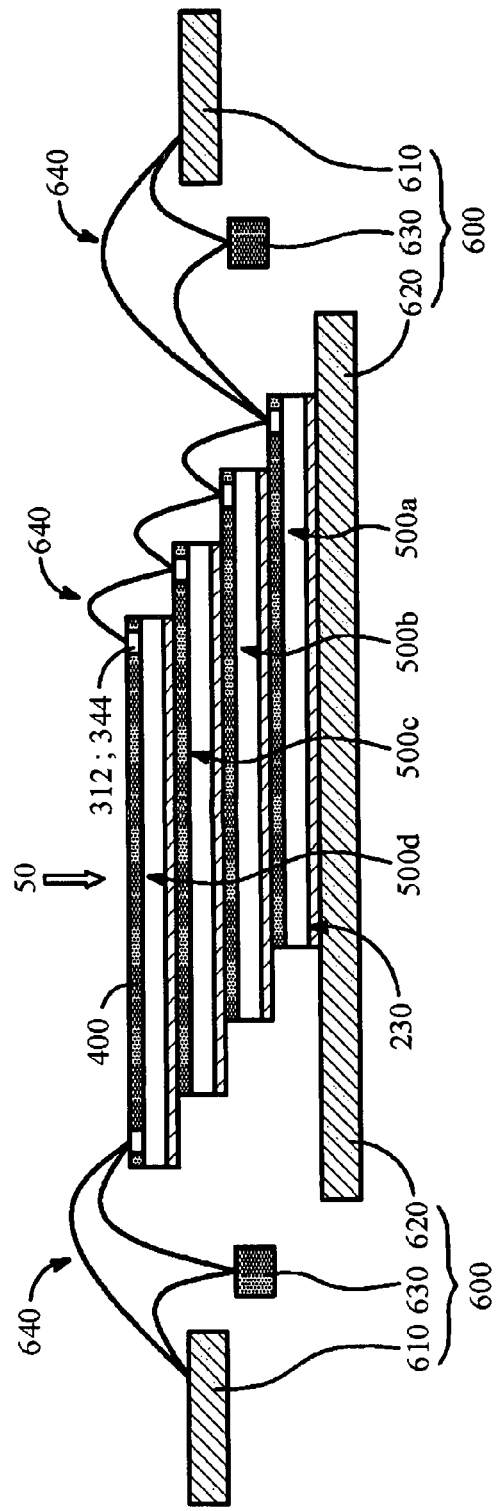

CHIP-STACKED PACKAGE STRUCTURE HAVING LEADFRAME WITH MULTI-PIECE BUS BAR

BACKGROUND OF THE INVENTION

1. Field of the Invention

The present invention relates to an offset chip-stacked package structure, and more particularly, to an offset chip-stacked package structure with leadframe having multi-pieces bus bar.

2. Description of the Prior Art

In semiconductor post-processing, many efforts have been made for increasing scale of the integrated circuits such as memories while minimizing the occupied area. Accordingly, the development of three-dimensional (3D) packaging technology is in progress and the idea of making up a chip-stacked structure has been disclosed.

The prior art taught that a chip-stacked structure can be formed by firstly stacking a plurality of chips and then electrically connecting the chips to the substrate in a wire bonding process. FIG. 1A and FIG. 1B are cross-sectional views of a prior chip-stacked package structure for chips of same or similar sizes. As shown in FIG. 1A, the prior chip-stacked package structure 100 comprises a package substrate 110, a chip 120a, chip 120b, a spacer 130, a plurality of wires 140, and an encapsulant 150. The package substrate 110 is provided with a plurality of pads 112. The chips 120a and 120b are respectively provided with peripherally arranged pads 122a and 122b. The chip 120a is provided on the package substrate 110 while the chip 120b is provided on the chip 120a with a spacer 130 intervened there-between. The chip 120a is electrically connected to the package substrate 110 by bonding two ends of one of the wires 140 to the pads 112 and 122a respectively. The chip 120b is electrically connected to the package substrate 110 in similar manner. The encapsulant 150 is then provided on the package substrate 110 to cover the chips 120a and 120b and the wires 140.

Since the pads 122a and 122b are respectively provided at the peripheral of the chip 120a and the chip 120b, there is a need to apply the spacer 130 to prevent the chip 120b from directly contacting with the chip 120a for performing the subsequent wire-bonding process. However, the spacer 130 is used for increasing the thickness of the prior chip-stacked package structure 100.

Another prior chip-stacked package structure with different-sized chips has been disclosed. Referring to FIG. 1B, another conventional chip-stacked package structure 10 includes a package substrate 110, chips 120c and 120d, the plurality of wires 140, and an encapsulant 150. The package substrate 110 has pads 112 thereon. The size of chip 120c is larger than the chip's 120d. The chips 120c and 120d are respectively provided with peripherally arranged pads 122c and 122d. The chip 120c is provided on the package substrate 110 while the chip 120d is provided on the chip 120c. The chip 120c is electrically connected to the package substrate 110 by bonding two ends of one of the wires 140 to the pads 112 and 122c respectively. The chip 120d is electrically connected to the package substrate 110 in similar manner. The encapsulant 150 is then provided on the package substrate 110 to cover the chips 120c and 120d and the wires 140.

Since the size of chip 120d is smaller than chip's 120c, the pads 122c of chip 120c would not covered by the chip 120d when the chip 120d is stacked on the chip 120c. However, the condition that the size of the upper chip must be smaller than the lower chip that limits number of the chips to be stacked in the chip-stacked package structure 10.

In other words, the above-mentioned chip-stacked package structures have drawbacks of either increasing thickness of chip-stacked package structure 100 as shown in FIG. 1A or limiting number of the chips to be stacked as shown in FIG. 1B in which the size of the upper chip needs to be smaller than the lower chip. Moreover, there are also other problems that may lower reliability and yield of the chip-stacked package structures during processing when wire-jumping or wire-crossing bonding of the chips is considered. For example, a high-pressured mold-flow injection during molding may cause the jumping or crossing wires to shift and become short.

SUMMARY OF THE INVENTION

In view of the drawbacks and problems of the prior chip-stacked package structure as mentioned above, the present invention provides a three-dimensional chip-stacked structure for packaging multi-chips with similar size.

It is an object of the present invention to provide an offset chip-stacked package structure having leadframe with bus bar and so as to increase the scale of the integrated circuits while reducing the thickness in a package.

It is another object of the present invention to provide a leadframe having multi-piece bus bar which is used for an offset chip-stacked structure and so as to make circuit design more flexible and gain higher reliability.

According to abovementioned objects, the present invention provides an offset chip-stacked package structure having leadframe with bus bar, which comprising: a leadframe composed of a plurality of inner leads arranged in rows facing each other, a plurality of outer leads, and a die pad, wherein the die pad is provided between the plurality of inner leads arranged in rows facing each other and is vertically distant from the plurality of inner leads; an offset chip-stacked structure provided on the die pad and electrically connected with the plurality of inner leads arranged in rows facing each other; and an encapsulant covering the offset chip-stacked structure and the leadframe; wherein the leadframe comprises at least a bus bar, which is provided between the plurality of inner leads arranged in rows facing each other and the die pad, the bus bar being formed by multiple pieces.

The present invention then provides an offset chip-stacked package structure having leadframe with bus bar, which comprising: a leadframe composed of a plurality of outer leads, a plurality of inner leads arranged in rows facing each other, and a die pad, wherein the die pad is provided between the plurality of inner leads arranged in rows facing each other and is vertically distant from the plurality of inner leads; an offset chip- stacked structure provided on the die pad and electrically connected with the plurality of inner leads arranged in rows facing each other; and an encapsulant covering the offset chip-stacked structure and the leadframe, the plurality of outer leads extending out of the encapsulant; wherein the leadframe comprises at least a bus bar, which is provided between the plurality of inner leads arranged in rows facing each other and the die pad, the bus bar being formed by multiple pieces.

The present invention further provides a leadframe structure having multi-piece bus bar, which comprising a plurality of inner leads in rows facing each other, a die pad provided between the plurality of inner leads and vertically distant from the plurality of inner leads, and at least a bus bar provided between the plurality of inner leads arranged in rows facing each other and the die pad, and the bus bar being formed by a plurality of metal fragments.

BRIEF DESCRIPTION OF THE DRAWINGS

FIG. 1 is a diagram schematically showing a conventional chip-stacked package structure.

FIG. 2A is a top-elevational view schematically showing the chip-stacked structure according to the present invention.

FIG. 2B is a cross-sectional view schematically showing the chip-stacked structure according to the present invention.

FIGS. 3A to 3C are diagrams schematically showing the redistribution layer formed in a process according to the present invention.

FIGS. 7A to 7B are top-elevational views schematically showing an offset chip-stacked package structure according to another embodiment of the present invention.

FIG. 10 is a cross-sectional view schematically showing an offset chip-stacked package structure according to another embodiment of the present invention.

FIG. 11 is a cross-sectional view schematically showing an offset chip-stacked package structure according to another embodiment of the present invention.

DESCRIPTION OF THE PREFERRED EMBODIMENT

The present invention will now be described more fully hereinafter with reference to the accompanying drawings, in which preferred embodiments are shown. In the following, the well-known knowledge regarding the chip-stacked structure of the invention such as the formation of chip and the process of thinning the chip would not be described in detail to prevent from arising unnecessary interpretations. However, this invention will be embodied in many different forms and should not be construed as limited to the embodiments set forth herein.

According to the semiconductor packaging process, a Front-End-Process experienced wafer is performed a thinning process firstly to reduce the thickness to a value between 2 mil and 20 mil, and then the polished wafer is applied with a polymer material such as a resin or a B-Stage resin by coating or printing. Next, a post-exposure baking or lighting process is applied to the polymer material so that the polymer material becomes a viscous semi-solidified gel-like material. Subsequently, a removable tape is attached to the viscous semi-solidified gel-like material and then the wafer is sawed into chips or dies. At last, these chips or dies are stacked on and connected to a substrate to form a chip-stacked structure.

Figure 2C:
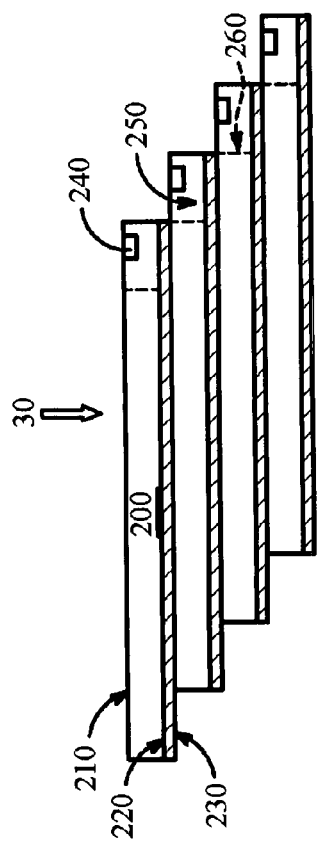
FIGS. 2C to 2E are cross-sectional views schematically showing the offset chip-stacked structure according to the present invention.

Referring to FIGS. 2A and 2B, a chip 200 experiencing the above-mentioned processes has an active surface 210 and a back surface 220 in opposition to the active surface 210 with an adhesive layer 230 formed on the back surface 220. It is to be noted that the adhesive layer 230 is not limited to the above-mentioned semi-solidified gel-like material and can be any adhesive material, such as die-attached film, for joining the chip 200 and a substrate together. Moreover, in the embodiment of the present invention, the active surface 210 of chip 200 is thereon provided with a plurality of pads 240 arranged along a side edge of chip 200. Accordingly, an offset chip-stacked structure 30 as shown in FIG. 2C can be formed. The offset chip-stacked structure 30 is a ladder-like structure formed by aligning the side edge of upper chips with the edge line 260 of the bonding area 250 on lower chips. The edge line 260 herein is a line for reference only but not a line exists on chip 200.

Figure 2D:
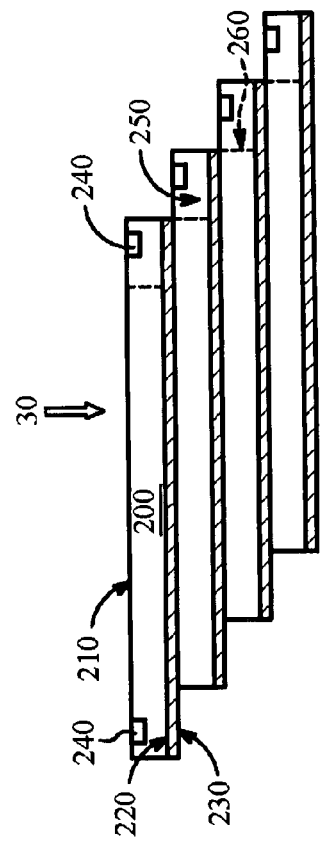
Figure 2E:
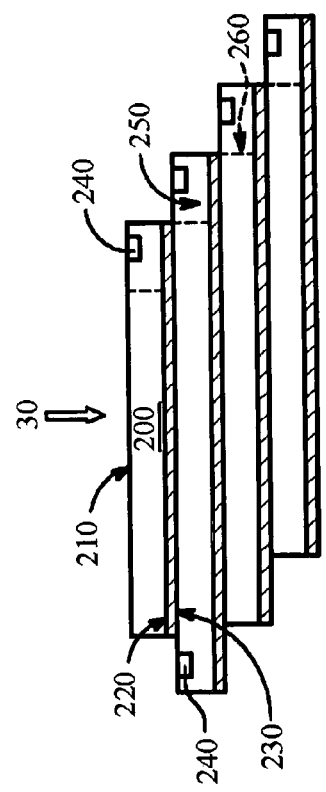

Referring to FIG. 2D, the uppermost chip of the structure 30 can further have same pads as the pads 240 on the other side for providing more connections with the substrate. Referring to FIG. 2E, the size of uppermost chip of the structure 30 is smaller than the lower chip. The arrangement of the pads 240 or the size of the chips described herein is for embodying but not limiting the invention. Any chip-stacked package structure satisfying the above-mentioned statement would be regarded as an aspect of the invention.

Referring to FIGS. 3A to 3C, the process of making a chip with redistribution layer is disclosed. According to the present invention, a redistribution layer (RDL) is formed with pads provided along a side edge of the chip and the details are described as follows.

As shown in FIG. 3A, the chip 310 has first pads 312a and second pads 312b on the active surface and along side edges. The first pads 312a are pads located inside a bonding area 320, while the second pads 312b are pads located outside the bonding area 320. As shown in FIG. 3B, a first passivation layer 330 with a plurality of first openings 332 for exposing the first pads 312a and the second pads 312b is first formed on the chip 310, and a redistribution layer 340 with a plurality of conductive wires 342 and a plurality of third pads 344 is then formed on the first passivation layer 330. The third pads 344 are located inside the bonding area 320 and the conductive wires 342 electrically connect the second pads 312b and the third pads 344. The redistribution layer 340 is made up of conductive materials such as gold, copper, nickel, titanium tungsten, titanium or others. As shown in FIG. 3C, a whole chip structure 300 is completed by forming a second passivation layer 350 with a plurality of second openings 352 on the redistribution layer 340 to cover the area rather than the first pads 312a and the third pads 344 but expose the first pads 312a and the third pads 344.

It is to be noted that the first pads 312a and the second pads 312b can be arranged on surface of the chip 310 not only in the above-mentioned peripheral type but also in an area array type or other types rather than the above-mentioned types, provided that the second pads 312b are electrically connected with the third pads 344 via the conductive wires 342. Moreover, the third pads 344 can be arranged in a manner of being along side edge of the chip 310 and in parallel to the pads 312*a* such as shown in FIG. 3B or other manners such as in single row or two rows provided that the third pads 344 are located inside the bonding area 320.

Figure 4A:
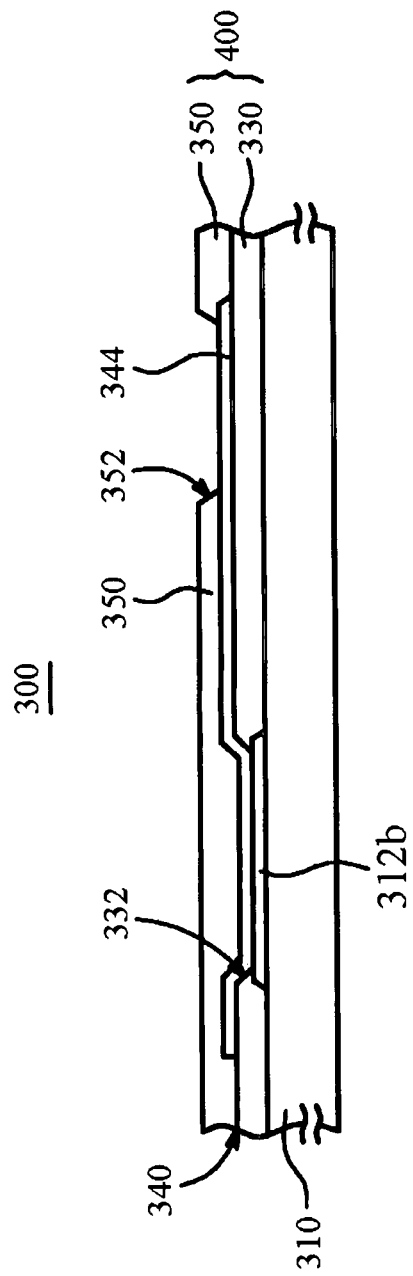
FIGS. 4A to 4B are cross-sectional views schematically showing the bonding area on the redistribution layer according to the present invention.
Figure 4B:
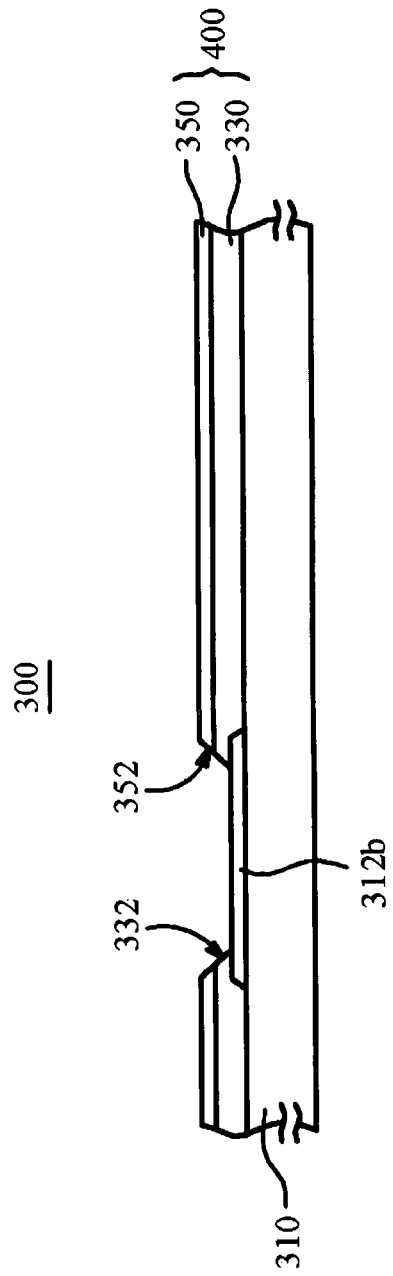

Referring now to FIGS. 4A and 4B, show the cross-sectional views drawn along section lines A-A' and B-B' in FIG. 3C. According to FIG 3C, the whole chip structure 300 is composed of the chip 310 and the redistribution layer 400. The redistribution layer 400 is composed of first passivation layer 330, redistribution layer 340, and second passivation layer 350. The bonding area 320 of the chip 310 is a side edge adjacent to the chip 310. Moreover, the chip 310 has a plurality of first pads 312*a* and second pads 312*b*, wherein the first pads 312*a* are inside the bonding area 320 and the second pads 312*b* are outside the bonding area 320.

The first passivation layer 330 disposed on the chip 310 has a plurality of first openings 332 to expose the first pads 312*a* and the second pads 312*b*. The redistribution layer 340 with a plurality of third pads 344 is disposed on the first passivation layer 330 and extends from the second pads 312*b* to bonding area 320, where the third pads 344 are located. The second passivation layer 350 covers the redistribution layer 340 and first pads 312*a* and third pads 344 are exposed through a plurality of second openings 352. Since the first pads 312*a* and third pads 344 are in the bonding area 320, the area outside of the bonding area 320 on the second passivation layer 350 is capable of carrying another chip structure and therefore accomplishing an offset chip-stacked structure 30.

Figure 5A:
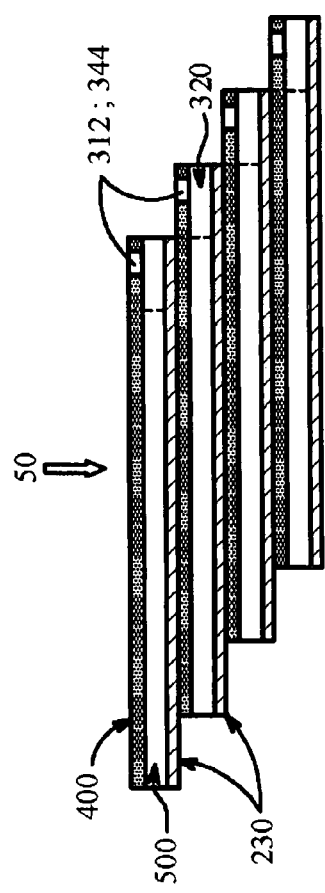
FIGS. 5A to 5C are cross-sectional views schematically showing an offset chip-stacked structure with redistribution layer according to the present invention.
Figure 5B:
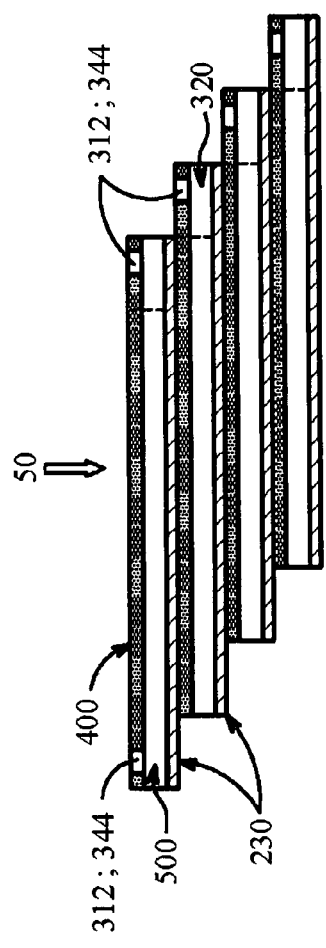
Figure 5C:
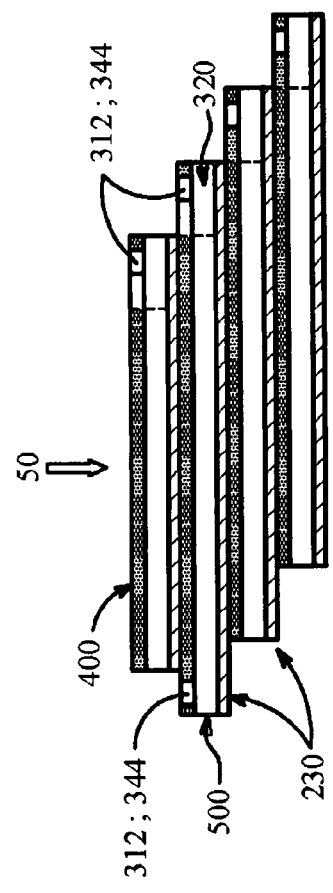

Referring to FIG. 5A, shows an offset chip-stacked structure 50 of the present invention. The offset chip-stacked structure 50 includes a plurality of stacked chips 500. Each one of the chips 500 is formed with a redistribution layer 400 so that each one of the chips 500 can be provided with pads 312*b* inside the bonding area 320 on each chip. In this way, the offset chip-stacked structure 50 is formed by aligning the side edge of upper chips with an edge line of the bonding area 320 on lower chips and an adhesive layer 230 formed by a polymer material is used to connect any two chips among the plurality of chips 500. Moreover, in FIG. 5B, the uppermost chip of the offset chip-stacked structure 50 can further have same pads as the pads 312 on the other side for providing more connections with the substrate and the method for forming this kind of structure is as shown in FIG. 4B. Referring to FIG. 5C, the size of the uppermost chip of the offset chip-stacked structure 50 can be smaller than that of the lower one. The arrangement of the first pads 312 and third pads 344 or the size of the chips 500 described herein is for embodying but not limiting the invention. Any chip-stacked structure satisfying the above-mentioned statement would be regarded as an aspect of the invention. For example, each one of the chips 500 can be formed with bonding areas that are not only on the right side but also on the left side.

In the following, a chip-stacked package structure of the present invention will be disclosed, in which the above-mentioned offset chip-stacked structure 50 will be taken as an example for illustration. However, the following descriptions can also be applied to the above-mentioned offset chip-stacked structure 30.

Figure 6A:
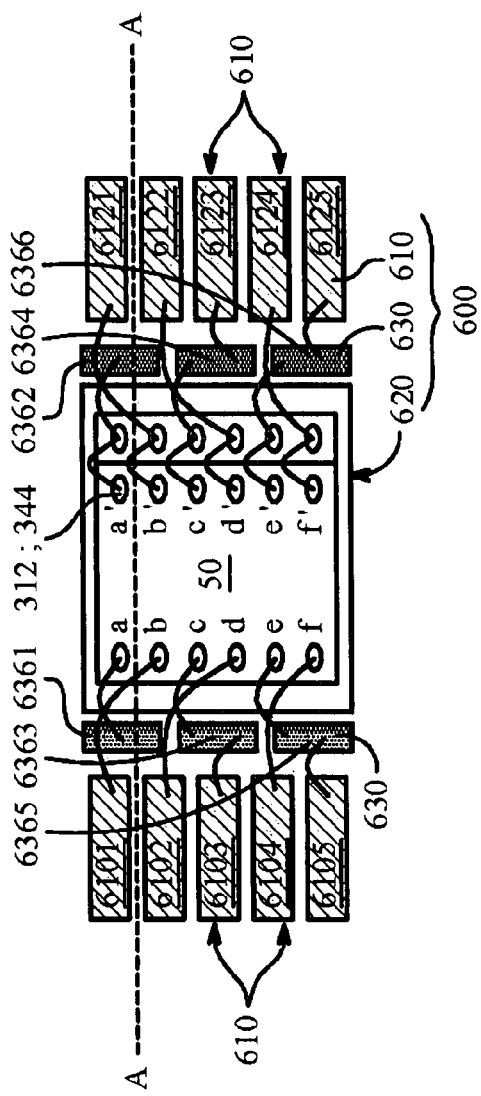
FIGS. 6A to 6B are top-elevational views schematically showing an offset chip-stacked package structure according to the present invention.
Figure 6B:
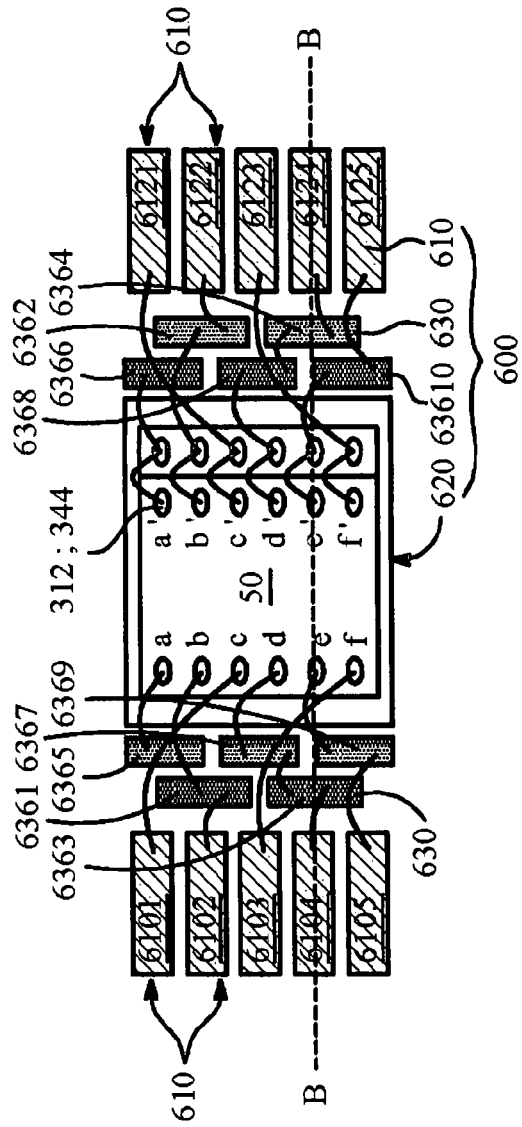

Referring to FIGS. 6A and 6B, shows the plane views of a chip-stacked package structure of the present invention. As shown in FIGS. 6A and 6B, the chip-stacked package structure comprises a leadframe 600 and an offset chip-stacked structure 50, wherein the leadframe 600 is composed of a plurality of inner leads 610 arranged in rows facing each other, a plurality of outer leads (not shown), and a die pad 620. The die pad 620 is provided between the plurality of inner leads 610. The plurality of inner leads 610 and the die pad 620 can be vertically distant from each other or at the same height. In the present embodiment, the offset chip-stacked structure 50 is set on the die pad 620 and is connected to the plurality of inner leads 610 of leadframe 600 with metal wires 640.

Then, referring to FIGS. 6A and 6B, the leadframe 600 of chip-stacked package structure of the present invention further comprises at least a bus bar 630 provided between the die pad 620 and the plurality of inner leads 610 arranged in rows facing each other, wherein the bus bar 630 can be arranged in a stripe-shaped configuration and each bus bar 630 is formed by a plurality of metal fragments 636 as shown in FIGS. 6A and 6B; meanwhile, the bus bar 630 can also be arranged in a ring-shaped configuration and each bus bar 630 is also formed by a plurality of metal fragments 636, as shown in FIGS. 7A and 7B. Moreover, as what is described above, the first pads 312 and the third pads 344 in the bonding area 320 of chip 500 can be arranged in single row, as shown in FIGS. 6A, 6B, 7A, and 7B or two rows and is not limited in the present invention. Moreover, the bus bar 630 in the present invention is formed by a plurality of metal fragments 636 and each metal fragment 636 is independent. Thus, the leadframe 600 can be provided with bus bar 630 formed by a plurality of fragments 636 which can be served as an electrical connections such as power connections, ground connections, and signal connections, and the flexibility in circuit design or application is thus enhanced.

The description will go to the part of using the bus bar 630 to accomplish jumping connections of metal wires 640, referring to FIG. 6A. In FIG. 6A, the pads on offset chip-stacked structure 50 are connected with the inner leads of leadframe. Apparently, the bus bar 630 is formed by a plurality of metal fragments 636 that can be served as transferring pads for making jumping connections between the pads with letter "a" ("a'") to "f" ("f'") and the inner leads 6101 (6121) to 6105 (6125) and thus the metal wires 640 would not cross each other. For example, a metal wire 640 has its one end connected to the pad with letter "a" on offset chip-stacked structure 50 and the other end connected to the metal fragment 6361 of bus bar 630 with the metal fragment 6361 served as transferring pad for ground connection; then the pad with letter "b" is connected to the inner lead 6101; then another wire 640 has its one end connected to the pad with letter "c" on the offset chip-stacked structure 50 and the other end connected to the metal fragment 6363 of bus bar 630; then another wire 640 connects the metal fragment 6363 of bus bar 630 and the inner lead 6103. Thus, the connection between the pad with letter "c" and the inner lead 6103 can be made without crossing the wire connecting the pad with letter "d" and the inner lead 6102. Then the jumping connection of the pad with letter "e" and the inner lead 6105 is performed. A metal wire 640 has its one end connected to the pad with letter "d" on offset chip-stacked structure 50 and the other end connected to the metal fragment 6365 of bus bar 630, and then the metal fragment 6365 of bus bar 630 is connected to the inner lead 6105 with another metal wire 640. Thus, the connection between the pad with letter "e" and the inner lead 6105 can be made without crossing the wire 640 connecting the pad with letter "f" and the inner lead 6104. And the jumping connection between the pads with letter"a'" to "f'" and the inner leads 6121 to 6125 on another side edge is also made with the metal fragments 6362 to 6366 of bus bar 630 as transferring pads. The connecting process is the same with what is described above. The connection between the pads with letter "a'" to "f'" and the inner leads 6121 to 6125 can be made without crossing metal wires 640.

In another embodiment, the structure of more than one bus bar 630 can be used for performing the jumping connection of the plurality of pads on the offset chip-stacked structure 50, as shown in FIG. 6B. In FIG. 6B, the pads on offset chip-stacked structure 50 are connected with the inner leads. Apparently, the plurality of metal fragments 636 forming bus bar 630 can be served as transferring pads for making jumping connections between the pads (with letter "a/a'~f/f'") and the inner leads 610 and thus the metal wires 640 would not cross each other. For example, a metal wire 640 has its one end connected to the pad with letter "a" or"a'" on offset chip-stacked structure 50 and the other end connected to the metal fragment 6365 or 6366 of bus bar 630 with the metal fragment 6365 or 6366 served as transferring pad for ground connection; then a metal wire 640 has its one end connected to the pad with letter "b" or "b'" on offset chip-stacked structure 50 and the other end connected to the metal fragment 6361 or 6362 of bus bar 630; and another metal wire 640 has its one end connected to the metal fragment 6361 or 6362 of bus bar 630 and the other end connected to the inner lead 6102 or 6122. Thus, the connection between the pad with letter "b" or "b'" and the inner lead 6102 or 6122 can be made without crossing the metal wire 640 connecting the pad with letter "c" or "c'" and the inner lead 6102 or 6122. Then the jumping connection of the pad with letter "d" or "d'" and the inner lead 6104 or 6124 is performed. A metal wire 640 has its one end connected to the pad with letter "d" or "d'" on offset chip-stacked structure 50 and the other end connected to the metal fragment 6367 or 6368 of bus bar 630, and then the metal fragment 6367 or 6368 of bus bar 630 is connected to the metal fragment 6363 or 6364 with another metal wire 640; finally, the metal fragment 6363 or 6364 is connected to the inner lead 6104 or 6124 with another metal wire 640. Thus, the connection between the pad with letter "d" or"d'" and the inner lead 6104 or 6124 can be made without crossing the metal wire 640 connecting the pad with letter "f" or "f'" and the inner lead 6103 or 6123. Then the pad with letter "e" or "e'" is also connected to the metal fragment 6369 or 63610 of bus bar 630, and the metal fragment 6369 or 63610 is connected to the inner lead 6105 or 6125 with another metal wire 640. Thus, the connection between the pad with letter "e" or"e'" and the inner lead 6104 or 6124 can also be made without crossing the metal wire 640 connecting the pad with letter "f"or"f'" and the inner lead 6103 or 6123.

Consequently, the bus bar 630 formed by the plurality of metal fragments 636 of leadframe 600 provides a plurality of transferring pads for jumping connections to prevent metal wires from crossing each other, avoid unnecessary short, and enhance the reliability of chip packaging. Meanwhile, the leadframe 600 with bus bar 630 formed by the plurality of metal fragments 636 also makes the circuit design more flexible. The jumping connection of metal wires can be performed according to the structure of bus bar 630 such as that shown in FIG. 7A or FIG. 7B and the wires can be prevented from crossing each other. The connecting process is similar to that in FIG. 6 and would not be given unnecessary details herein.

It is to be noted that the offset chip-stacked structure 50 is set on the leadframe 600 and the chips 500 can be that having same size and performing same function such as memory chips or chips having different sizes and performing different functions such as the case shown in FIGS. 2E and 5C (the chips on the uppermost layer being drive chips and the rest being memory chips). The detailed description for size and function of these chips is omitted hereinafter.

Figure 8:
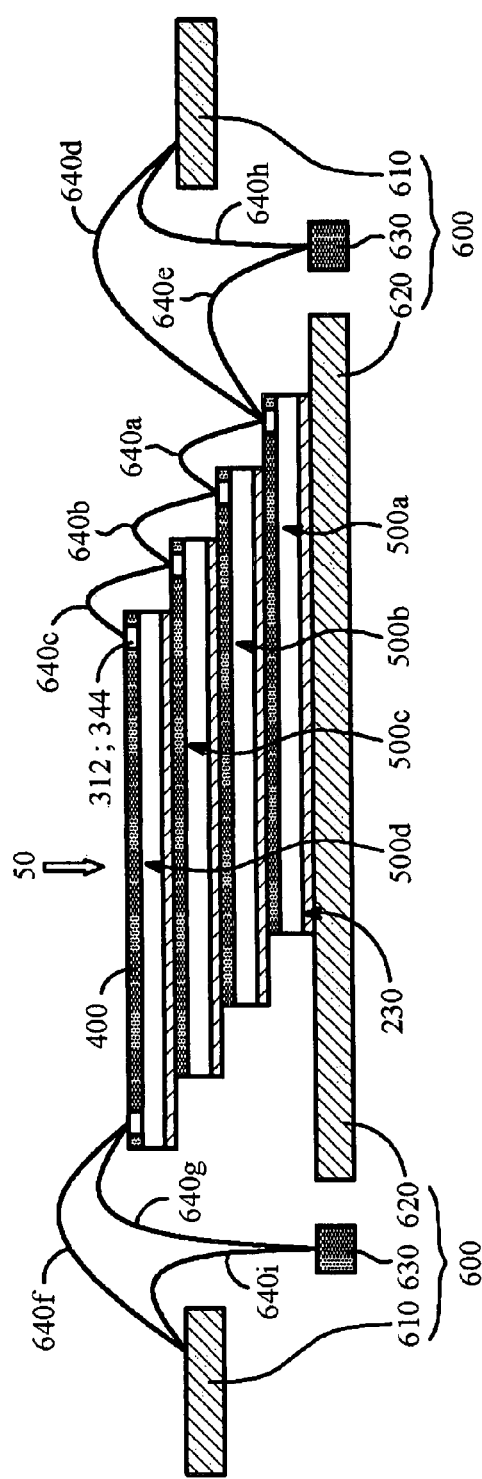
FIG. 8 is a cross-sectional view schematically showing an offset chip-stacked package structure according to the present invention.

Referring to FIG. 8, which is a cross-sectional view of the offset chip-stacked package structure in FIG. 6A drawn along section line A-A. As shown in FIG. 8, the leadframe 600 and the offset chip-stacked structure 50 are connected with a plurality of metal wires 640, wherein the leadframe 600 is composed of a plurality of inner leads 610 arranged in rows facing each other, a plurality of outer leads (not shown), and a die pad 620. The die pad 620 is provided between the plurality of inner leads 610 and is vertically distant from the plurality of inner leads 610. At least a bus bar 630 arranged in a stripe-shaped or ring-shaped configuration is provided between the inner leads 610 and the die pad 620 and is formed by a plurality of metal fragments 636. The bus bar 630 in the present embodiment and the die pad 620 are vertically at the same height. The metal wire 640a has one end connected to the first pads 312a or third pads 344 of the chip 500a (first pads 312a or thirds pad 344 described in FIG. 3 B or FIG. 3C for example) and has the other end connected to the first pads 312a or third pads 344 of the chip 500b in a wire-bonding process. Similarly, the metal wire 640b has one end connected to the first pads 312a or third pads 344 of the chip 500b and has the other end connected to the first pads 312a or third pads 344 of the chip 500c in a wire-bonding process. The metal wire 640c has one end connected to the first pads 312a or the third pads 344 of the chip 500c and has the other end connected to the first pads 312a or the third pads 344 of the chip 500d in a wire-bonding process. The metal wire 640d has one end connected to the first pads 312a or the third pads 344 of the chip 500a and has the other end connected to the plurality of inner leads 610 arranged in rows facing each other of leadframe 600 in a wire-bonding process. In this way, the chips 500a, 500b, 500c and 500d are electrically connected to the leadframe 600 when the wire-bonding processes of the metal wires 640a, 640b, 640c, and 640d are completed, wherein these metal wires 640 can be gold made wires.

Moreover, the leadframe 600 is provided with bus bar 630 as transferring pad for electrical connections such as power connections, ground connections, or signal connections. For example, when the plurality of metal fragments 636 that form the bus bar 630 are served as transferring pads for electrical connection, the metal wire 640e has its one end connected to a pad (pad with letter "c'" for example) of the chip 500a and has its other end connected to a metal fragment of bus bar (the metal fragment 6364 for example), and the metal wire 640h has its one end connected to the metal fragment 6364 of bus bar and has its other end connected to one of the inner leads (inner lead 6123 for example). Moreover, the uppermost chip 500d of the structure 50 can further have same pads as the pads 312 and 344 on the other side such as the arrangement shown in FIGS. 2D and 5B. Therefore, on the other side of chip 500d, a plurality of metal wires 640f are used to connect the chip 500d (pad with letter "b" for example) and one of the inner leads (inner lead 6101 for example), while a metal wire 640g has its one end connected to a pad (pad with letter "c" for example) of chip 500d and the other end connected to a metal fragment of bus bar (metal fragment 6363 for example) and a metal wire 640i is used to connect the metal fragment 636 to one of the inner leads (inner lead 6103 for example).

According to the above description, in the embodiment of the present invention, one end of metal wire 640e can be selectively connected to the pads 312a or 344 of chip 500a, and another end of metal wire 640e can be connected to the bus bar 630 or selectively connected to one or a plurality of metal fragments 636. The pads (312a; 344) on chip-stacked structure 50 can be used with more flexibility since the bus bar 630 is provided with one or a plurality of metal fragments 636. For example, by using this structure of bus bar 630, some metal fragments 636 such as metal fragment 6361 in FIG. 6A can be used for ground connection, some metal fragments 636 can be used for power connection, and some metal fragments 636 such as metal fragments 6363 and 6365 in FIG. 6A can be used for signal connection. Thus these metal fragments 636 can be arranged to have the function of transferring pads for electrical connection. The jumping connection of pads on chip-stacked structure 50 can thus be made by using metal fragments 636 and without crossing other metal wires. This prevents the bending degree of metal wires from increasing and enables flexibility in the circuit design or application and thus raises the yield and reliability in package processing.

Figure 9:
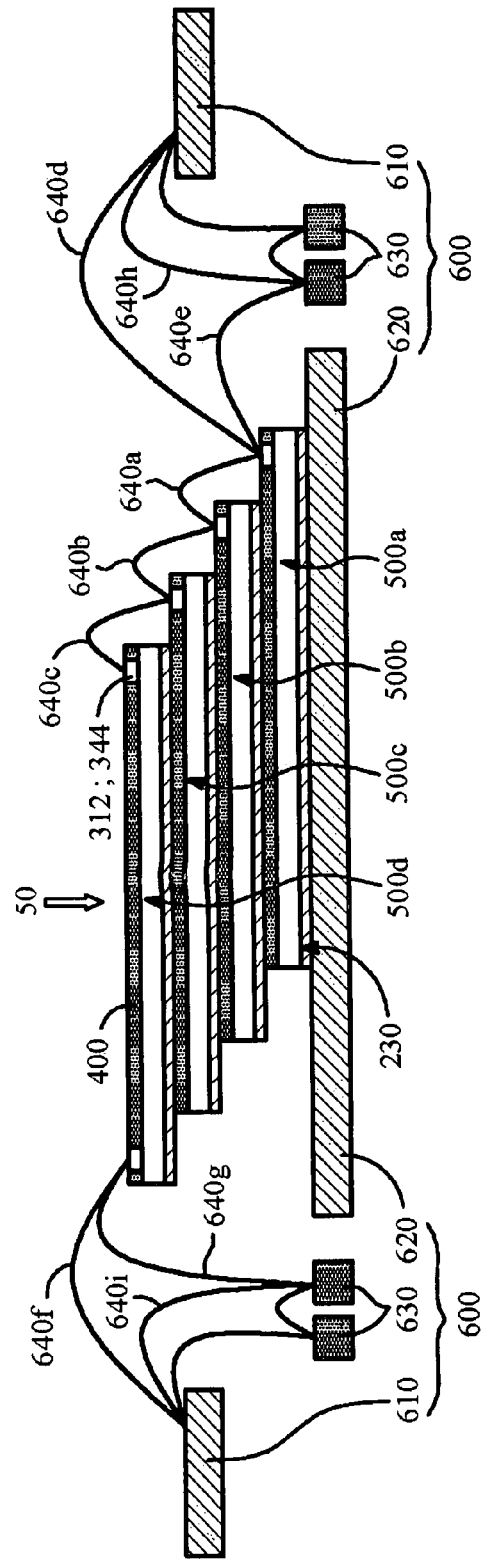
FIG. 9 is a cross-sectional view schematically showing an offset chip-stacked package structure according to another embodiment of the present invention.

Referring to FIG. 9, which is a cross-sectional view of another embodiment of the offset chip-stacked structure of FIG. 6B drawn along section line B-B. As shown in FIG. 9, the difference between FIG. 9 and FIG. 8 is that the bus bar 630 in FIG. 9 is a structure of a plurality of bus bars, and the plurality of bus bars 630 can be arranged in a stripe-shaped configuration as shown in FIG. 6B or in a ring-shaped configuration as shown in FIG. 7B. Similarly, the bus bars 630 in the present embodiment are also provided with a plurality of metal fragments 636. Apparently, increasing the number of the bus bars and therefore the number of transferring pads makes the connection of the pads (312a; 344) on the structure 50 more flexible. For example, by using the structure of bus bars 630, certain metal fragments 636 or some metal fragments 636 on certain bus bar 630 can be used for ground connection, certain metal fragments 636 or some metal fragments 636 on certain bus bar 630 can be used for power connection, and certain metal fragments 636 or some metal fragments 636 on certain bus bar 630 can even be used for signal connection. Thus these metal fragments 636 can be arranged to have the function of transferring pads for electrical connection as shown in FIG. 6B or 7B. Moreover, the connection between bus bars 630 makes the electrical connections of bus bars 630 such as power connections, ground connections, or signal connections more flexible. The jumping connection of pads on chip-stacked structure 50 can thus be made by using metal fragments 636 and without crossing other metal wires. This prevents the bending degree of metal wires from increasing and enables flexibility in the circuit design or application and thus raises the yield and reliability in package processing. The connecting process with a plurality of wires 640 between the leadframe 600 and the offset chip-stacked structure 50 in FIG. 9 is the same as that in FIG. 8 and would not be given unnecessary details herein.

Referring to FIG. 10, which is a cross-sectional view of another embodiment of the offset chip-stacked structure of FIG. 6A drawn along section line A-A. As shown in FIG. 10, the leadframe 600 and the offset chip-stacked structure 50 are connected with a plurality of metal wires 640, wherein the leadframe 600 is composed of a plurality of inner leads 610 arranged in rows facing each other, a plurality of outer leads (not shown), and a die pad 620. The die pad 620 is provided between the plurality of inner leads 610 and is vertically distant from the plurality of inner leads 610. At least a bus bar 630 arranged in a stripe-shaped or ring-shaped configuration is provided between the inner leads 610 and the die pad 620 and is formed by a plurality of metal fragments 636. What is particular in the present embodiment is that the bus bar 630 and the plurality of inner leads 610 are vertically at the same height. The offset chip-stacked structure 50 is first connected to and then wire-bonded to the leadframe 600. The process of wire-bonding the offset chip-stacked structure 50 to the leadframe 60 is similar to that described above and would not be given unnecessary details herein. Meanwhile, the leadframe 600 in the present embodiment is provided with bus bar 630 formed by a plurality of metal fragments 636. With the connection of wires 640, the plurality of metal fragments 636 can be used for electrical connections such as power connections, ground connections or signal connections, meaning that first pads 312a or third pad 344 of offset chip-stacked structure 50 can be selectively connected with metal fragments 636. It is to be noted that although bus bar 630 in FIG. 10 is a stripe-shaped structure or a ring-shaped structure, yet a plurality of bus bars 630 can also be applied according to the complexity of circuit design in different embodiments; the application of a plurality of bus bars 630 is the same as the embodiment in FIG. 9 and would not be given unnecessary details herein.

Referring to FIG. 11, which is a cross-sectional view of still another embodiment of the offset chip-stacked structure of FIG. 6A drawn along section line A-A. As shown in FIG. 11, the leadframe 600 and the offset chip-stacked structure 50 are connected with a plurality of metal wires 640, wherein the leadframe 600 is composed of a plurality of inner leads 610 arranged in rows facing each other, a plurality of outer leads (not shown), and a die pad 620. The die pad 620 is provided between the plurality of inner leads 610 and is vertically distant from the plurality of inner leads 610. At least a stripe-shaped or a ring-shaped bus bar 630 is provided between the inner leads 610 and the die pad 620. Apparently, the leadframe 600 and the offset chip-stacked structure 50 in FIG. 11 are similar to the leadframe 600 and the offset chip-stacked structure 50 in FIGS. 9 and 10, and the only difference is that the bus bar 630 is vertically at a different height, wherein bus bar 630 in FIG. 11 is provided between the inner leads 610 of leadframe 600 and die pad 620 and is formed by a plurality of metal fragments 636. The bus bar 630, the inner leads 610, and the die pad 620 are vertically at different heights. Similarly, the bonding process is the same as what is described above and would not be given unnecessary details herein. Meanwhile, the leadframe 600 in the present embodiment is provided with bus bar 630 formed by a plurality of metal fragments 636. With the connection of wires 640, the plurality of metal fragments 636 can be used for electrical connections such as power connections, ground connections or signal connections, meaning that first pads 312a or third pads 344 of offset chip-stacked structure 50 can be selectively connected with metal fragments 636. It is to be noted that although bus bar 630 in FIG. 11 is a stripe-shaped structure or a ring-shaped structure, yet a plurality of bus bars can also be applied according to the complexity of circuit design in different embodiments; the application of a plurality of bus bars 630 is the same as the embodiment in FIG. 9 and would not be given unnecessary details herein.

Figure 12:
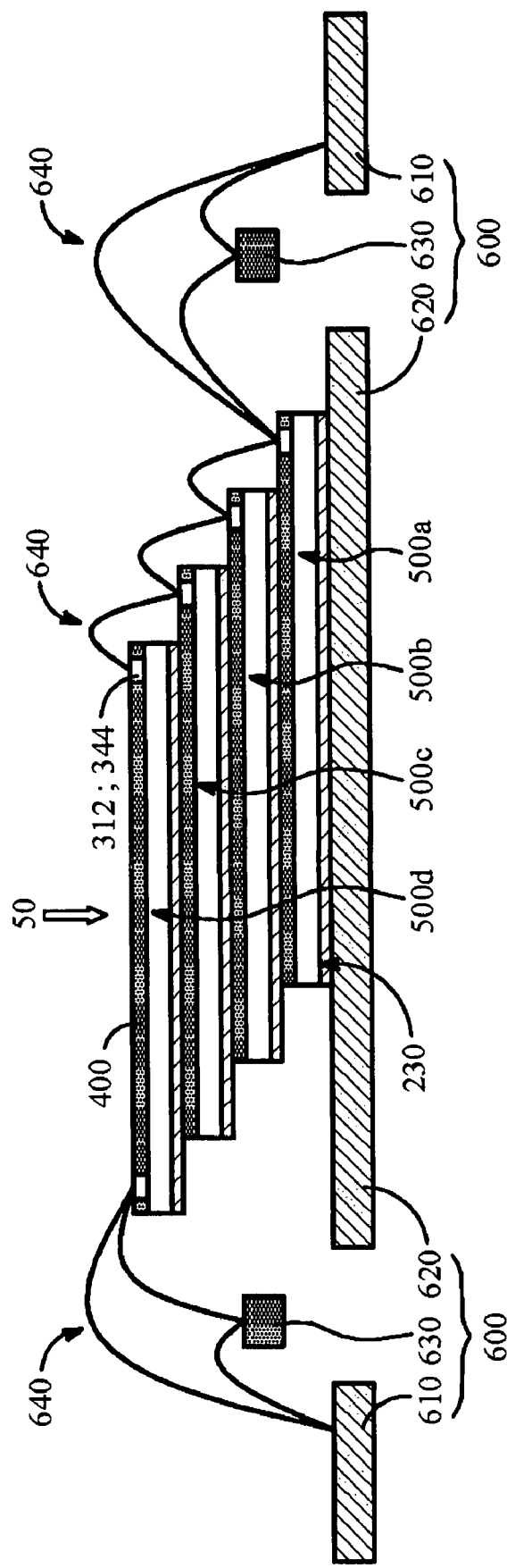
FIG. 12 is a cross-sectional view schematically showing an offset chip-stacked package structure according to another embodiment of the present invention.

Then, referring to FIG. 12, which is a cross-sectional view of still another embodiment of the offset chip-stacked structure of FIG. 6A drawn along section line A-A. As shown in FIG. 12, the leadframe 600 in the present embodiment is composed of a plurality of inner leads 610 arranged in rows facing each other, a plurality of outer leads (not shown), and a die pad 620. The die pad 620 is provided between the plurality of inner leads 610 and is vertically at the same height as the plurality of inner leads 610. At least a bus bar 630 is provided between the inner leads 610 and the die pad 620, wherein the bus bar 630 is formed by a plurality of metal fragments 636 and is vertically distant from the inner leads 610 and the die pad 620. Similarly, the structure 50 is first connected to and then wire-bonded to the leadframe 600. The process of wire-bonding the offset chip-stacked structure 50 to the leadframe 60 is similar to that described above and would not be given unnecessary details herein. Meanwhile, the leadframe 600 in the present embodiment is provided with bus bar 630 formed by a plurality of metal fragments 636. With the connection of wires 640, the plurality of metal fragments 636 can be used for electrical connections such as power connections, ground connections or signal connections, meaning that first pads 312a or third pads 344 of offset chip-stacked structure 50 can be selectively connected with metal fragments 636. It is to be noted that although bus bar 630 in FIG. 12 is a stripe-shaped structure or a ring-shaped structure, yet a plurality of bus bars 630 can also be applied according to the complexity of circuit design in different embodiments; the application of a plurality of bus bars 630 is the same as the embodiment in FIG. 9 and would not be given unnecessary details herein.

Figure 13:
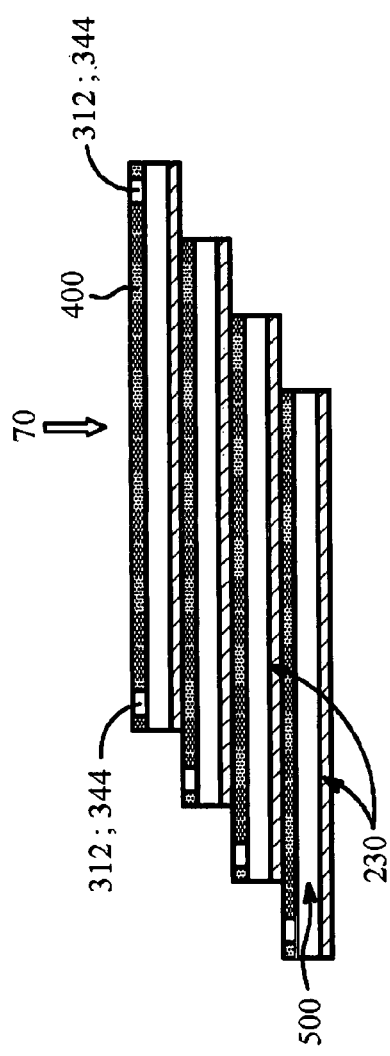
FIG. 13 is a cross-sectional view schematically showing an offset chip-stacked structure according to another embodiment of the present invention.
Figure 14:
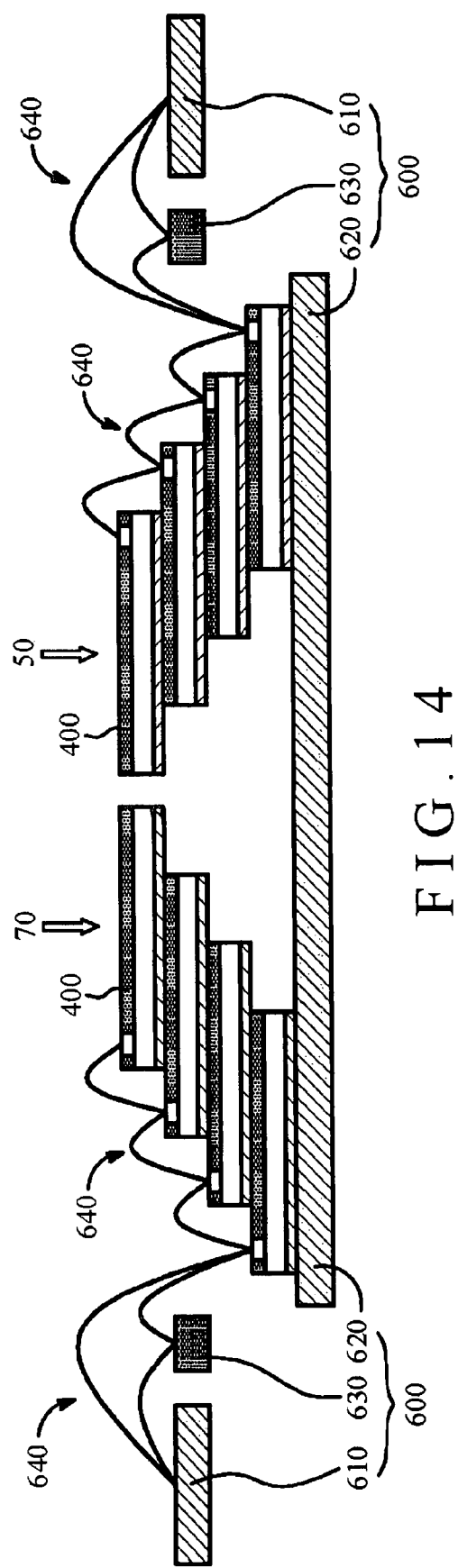
FIG. 14 is a cross-sectional view schematically showing a plurality of offset chip-stacked package structures according to another embodiment of the present invention.

As described in the above embodiments, the number of the chips of the chip-stacked structure 50 is not so limited, and any person skilled in the art could manufacture a chip-stacked structure 50 including at least three chips according to the above-disclosed method. Meanwhile, the direction toward which the offset of each chip occurs in forming the chip-stacked structure 50 is not so limited by the above-disclosed embodiments. The chip-stacked structure 50 can be formed with each chip having an offset toward the direction opposite to the original one disclosed in the above embodiments, as shown in FIG. 13. Referring to FIG. 13, the connection method for the chips of the chip-stacked structure 70 and the wire-bonding method for the chips and the leadframe are similar to that disclosed in the above-mentioned embodiments and would not be given unnecessary details herein Moreover, the present invention proposes a combination structure in which two offset chip-stacked structures with chips of each structure being offset toward opposite directions are combined together. An example of such is shown in FIG. 14. Referring to FIG. 14, the chip-stacked structures 50 and chip-stacked structure 70 are provided together on a die pad 620 of a leadframe 600. The connection method for the chips of the chip-stacked structures 70 and chip-stacked structure 50 and the wire-bonding method for the chips and the leadframe are similar to that disclosed in the above-mentioned embodiments and would not be given unnecessary details herein. Moreover, the leadframe 600 in the present embodiment is provided with bus bar 630 formed by a plurality of metal fragments 636. The increase of number of chips makes the circuit design more complex. However, with the connection of wires 640, metal fragments 636 that form bus bar 630 provided on leadframe 600 can be used as transferring pads for electrical connections such as power connections, ground connections, or signal connections. Each of first pads 312a or thirds pad 344 of the plurality of offset chip-stacked structures 50 can be selectively connected with metal fragments 636. It is to be noted that although bus bar 630 in FIG. 14 is a stripe-shaped structure or a ring-shaped structure, yet a plurality of bus bars can also be applied according to the complexity of circuit design in different embodiments; the application of a plurality of bus bars 630 is the same as the embodiment in FIG. 9 and would not be given unnecessary details herein. Meanwhile, the arrangement of bus bar 630 can include the arrangement in embodiments in FIGS. 8 to 12 as described abovementioned.

While the invention has been described by way of examples and in terms of the preferred embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A chip-stacked package structure having leadframe with multi-piece bus bar, comprising:
   a leadframe composed of a plurality of inner leads arranged in rows facing each other, a plurality of outer leads, and a die pad, wherein said die pad is provided between said plurality of inner leads arranged in rows facing each other and is vertically distant from said plurality of inner leads;
   an offset chip-stacked structure formed with a plurality of chips stacked together, said offset chip-stacked structure being provided on said die pad and electrically connected with said plurality of inner leads arranged in rows facing each other;
   an encapsulant covering said plurality of semiconductor chip structures and said leadframe, wherein said plurality of outer leads extend out of said encapsulant; and
   at least a bus bar, provided between said plurality of inner leads arranged in rows facing each other and said die pad, said bus bar being formed by a plurality of metal fragments.

2. The chip-stacked package structure as set forth in claim 1, wherein said bus bar and said die pad are vertically at the same height.

3. The chip-stacked package structure as set forth in claim 1, wherein said bus bar and said plurality of inner leads are vertically at the same height.

4. The chip-stacked package structure as set forth in claim 1, wherein said bus bar is vertically distant from said plurality of inner leads arranged in rows facing each other.

5. The chip-stacked package structure as set forth in claim 1, wherein said bus bar is arranged in a ring-shaped configuration.

6. The chip-stacked package structure as set forth in claim 1, wherein said bus bar is arranged in a stripe-shaped configuration.

7. The chip-stacked package structure as set forth in claim 1, wherein each one of said chips in said offset chip-stacked structure comprises:
   a chip provided with a bonding area, said bonding area being adjacent to one side edge or two neighboring side edges of said chip, wherein said chip is provided with a plurality of first pads in said bonding area and a plurality of second pads outside said bonding area;
   a first passivation layer provided on said chip, wherein said first passivation layer is provided with a plurality of first openings for exposing said plurality of first pads and said plurality of second pads;
   a redistribution layer formed with a plurality of third pads inside said bonding area, wherein said redistribution layer is provided on said first passivation layer for establishing connection between said plurality of second pads and said bonding area; and
   a second passivation layer covering said redistribution layer, wherein said second passivation layer has a plurality of second openings for exposing said plurality of first pads and said plurality of third pads.

8. A chip-stacked package structure having leadframe with multi-piece bus bar, comprising:
   a leadframe composed of a plurality of outer leads, a plurality of inner leads arranged in rows facing each other, and a die pad, wherein said die pad is provided between said plurality of inner leads arranged in rows facing each other and is vertically distant from said plurality of inner leads;
   a plurality of offset chip-stacked structures provided on said die pad and electrically connected with said plurality of inner leads arranged in rows facing each other; and
   an encapsulant covering said plurality of offset chip-stacked structures and said leadframe, said plurality of outer leads extending out of said encapsulant;

wherein said leadframe comprises at least a bus bar provided between said plurality of inner leads arranged in rows facing each other and said die pad, said bus bar being formed by a plurality of metal fragments.

9. The chip-stacked package structure as set forth in claim 8, wherein said bus bar and said die pad are vertically at the same height.

10. The chip-stacked package structure as set forth in claim 8, wherein said bus bar and said plurality of inner leads are vertically at the same height.

11. The chip-stacked package structure as set forth in claim 8, wherein said bus bar is vertically distant from said plurality of inner leads arranged in rows facing each other and said die pad.

12. The chip-stacked package structure as set forth in claim 8, wherein said bus bar is arranged in a ring-shaped configuration.

13. The chip-stacked package structure as set forth in claim 8, wherein said bus bar is arranged in a stripe-shaped configuration.

14. The chip-stacked package structure as set forth in claim 8, wherein each one of said chips in said offset chip-stacked structure comprises:
- a chip provided with a bonding area, said bonding area being adjacent to one side edge or two neighboring side edges of said chip, wherein said chip is provided with a plurality of first pads in said bonding area and a plurality of second pads outside said bonding area;
- a first passivation layer provided on said chip, wherein said first passivation layer is provided with a plurality of first openings for exposing said plurality of first pads and said plurality of second pads;
- a redistribution layer formed with a plurality of third pads inside said bonding area, wherein said redistribution layer is provided on said first passivation layer for establishing connection between said plurality of second pads and said bonding area; and
- a second passivation layer covering said redistribution layer, wherein said second passivation layer has a plurality of second openings for exposing said plurality of first pads and said plurality of third pads.

* * * * *